United States Patent
Ikeda et al.

(10) Patent No.: US 7,105,907 B2
(45) Date of Patent: Sep. 12, 2006

(54) GALLIUM NITRIDE COMPOUND SEMICONDUCTOR DEVICE HAVING SCHOTTKY CONTACT

(75) Inventors: Yoshito Ikeda, Ibaraki (JP); Kaoru Inoue, Otsu (JP); Yutaka Hirose, Nagaokakyo (JP); Katsunori Nishii, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 13 days.

(21) Appl. No.: 10/453,045

(22) Filed: Jun. 3, 2003

(65) Prior Publication Data

US 2004/0061194 A1 Apr. 1, 2004

(30) Foreign Application Priority Data

Jun. 5, 2002 (JP) .................................... 2002-164856

(51) Int. Cl.
| | |
|---|---|
| H01L 27/095 | (2006.01) |
| H01L 29/47 | (2006.01) |
| H01L 29/812 | (2006.01) |
| H01L 31/0328 | (2006.01) |
| H01L 29/80 | (2006.01) |

(52) U.S. Cl. .................. 257/473; 257/472; 257/485; 257/192; 257/280

(58) Field of Classification Search ............... 257/192, 257/194, 280, 471, 472, 473, 485, 81; 205/782
See application file for complete search history.

(56) References Cited

U.S. PATENT DOCUMENTS

| | | | |
|---|---|---|---|
| 5,705,830 A | | 1/1998 | Siergiej et al. ............... 257/77 |
| 5,977,565 A | * | 11/1999 | Ishikawa et al. ............. 257/81 |
| 6,809,352 B1 | * | 10/2004 | Nishii et al. ................ 257/192 |
| 2004/0112764 A1 | * | 6/2004 | Stokes et al. ............... 205/782 |

OTHER PUBLICATIONS

Q.Z. Liu et al., "Thermally stable PtSi Schottky contact on n–GaN," Appl. Phys. Lett. vol. 70, No. 10, Mar. 10, 1997, pp. 1275–1277.

Q.Z. Liu et al., "Ni and Ni silicide Schottky contacts on n–GaN," J. App. Phys., vol. 84, No. 2, Jul. 15, 1998, pp. 881–886.

Metal Contacts to N–Type GaN, Journal of Electronic Materials, vol. 27, No. 4, 1998, pp. 255–260.

"Cu3Ge Schottky contacts on n–GaN" by Hsin et al., Journal of Materials Science: Materials in Electronics (Apr. 2002) vol. 13, No. 4, pp. 203–206.*

* cited by examiner

Primary Examiner—Steven Loke

(57) ABSTRACT

A buffer layer, an undoped gallium nitride layer, and an n-type gallium nitride active layer are formed on a sapphire substrate. Ohmic contacts and a Schottky contact are then formed on the n-type gallium nitride active layer as a source contact, a drain contact and a gate contact, respectively. The Schottky contact is a copper alloy, such as palladium copper, in which the content by weight of copper is 5%.

16 Claims, 9 Drawing Sheets

Cu CONTENT BY WEIGHT(%)

Cu CONTENT BY WEIGHT(%)

FIG.9

|  | AuCu | PtCu | PdCu | NiCu |
|---|---|---|---|---|
| FILM THICKNESS | 2,000nm | 200nm | 200nm | 200nm |

GALLIUM NITRIDE COMPOUND SEMICONDUCTOR DEVICE HAVING SCHOTTKY CONTACT

CROSS-REFERENCE TO RELATED APPLICATIONS

This application is based on application No. 2002-164856 filed in Japan, the contents of which are hereby incorporated by reference.

BACKGROUND OF THE INVENTION (1) Field of the Invention

The present invention relates to a semiconductor device that includes a gallium nitride compound semiconductor layer, and in particular to an improvement in the material of a Schottky contact used in the semiconductor device.

(2) Related Art

With broader-band wireless communication in recent years, demands have heightened for circuits that are able to operate at high frequency. Semiconductor components in such high-frequency circuits must also be compatible with high frequencies. Gallium nitride compound semiconductor components are showing promise as high-frequency power device materials that respond to the demands.

A gallium nitride compound semiconductor refers to a semiconductor that is a compound of gallium nitride (GaN), aluminum gallium nitride (AlGaN), indium gallium nitride (InGaN), indium aluminum gallium nitride (InAlGaN), or the like. Generally, such a compound is expressed as $In_X Al_Y Ga_{1-X-Y} N$ ($0 \leq X<1$, $0 \leq Y<1$, $0 \leq X+Y<1$).

A gallium nitride compound semiconductor has high dielectric breakdown field strength, high thermal conductivity and high electron saturation velocity. Above all, a gallium nitride compound semiconductor of an AlGaN/GaN heterojunction structure has a field strength of $1*10^5$ V/cm, and an electron velocity that is twice that of a gallium arsenic compound semiconductor. For this reason, expectations are high that superior high frequency characteristics will be realized if finer gallium nitride compound semiconductors are able to be manufactured.

One type of circuit component that uses this kind of gallium nitride compound semiconductor is a metal semiconductor field effect transistor (MESFET). An MESFET is a field effect transistor (FET) that includes a gallium nitride compound semiconductor that is doped with an n-type dopant such as silicon or germanium and exhibits n-type characteristics, and on which a Schottky contact is arranged as a gate contact. Ohmic contacts are used as the source contact and the drain contact.

In order to have the field effect transistor operate at high frequency, it is necessary to shorten the length of the gate contacts, and lower the capacitance of the gate contacts themselves. In particular, in a device in which favorable high frequency characteristics are required, it is essential to have a fine gate of a sub-half-micron or less in length. However, when the gate length is shortened, adhesion between the gate contact and the gallium nitride compound semiconductor is poor, causing the Schottky contact to peel in the semiconductor process or to come off the substrate. This results in a problem of a reduced yield ratio.

Furthermore, generally a metal such as gold, platinum, palladium or nickel is used as the Schottky contact. However, the better the Schottky characteristics (such as barrier height and ideality factor n) of the metal material is, the more easily the Schottky contact peels.

For this reason, realization of superior Schottky characteristics with high frequency is a difficult technical problem.

Note that barrier height $\Phi b$ and ideality factor n are defined in Dieter K. Schroder, "Semiconductor Material and Device Characterization, Second Edition", John Wiley & Sons, Ltd., pp.168–173, July 1998.

SUMMARY OF THE INVENTION

In view of the stated problems, the object of the present invention is to provide a gallium nitride compound semiconductor device having a Schottky contact that has both superior Schottky characteristics and high adhesion.

In order to achieve the stated object, the present invention is a semiconductor device, including: a gallium nitride compound semiconductor layer; and a Schottky contact formed on the gallium nitride compound semiconductor layer and made of a copper alloy.

According to the stated structure, a gallium nitride compound semiconductor device having a Schottky contact that has high adhesion can be obtained.

Note that here "copper alloy" should be interpreted as including cases in which only copper is used.

Furthermore, it is preferable that the copper alloy contains one of palladium, gold, platinum, and nickel.

According to the stated structure, a gallium nitride compound semiconductor device having superior Schottky characteristics and high adhesion can be obtained.

Furthermore, it is preferable that the content by weight of copper in the copper alloy is 20% or less.

The stated structure particularly achieves superior Schottky characteristics.

In this way, copper alloy is used for the Schottky contact that is formed on the gallium nitride compound semiconductor layer. Therefore, superior adhesion can be realized while preserving the Schottky characteristics of the other metal (i.e. the metal other than the copper) in the copper alloy.

Characteristics of field effect transistors, such as drain voltage characteristics and current characteristics when forward voltage is applied to gate voltage, depend on Schottky characteristics of the gate contact. Consequently, if a metal such as palladium or platinum, which has superior Schottky characteristics, is used in the copper alloy, field effect transistors having superior characteristics can be manufactured with a high yield ratio.

Furthermore, by making such a field effect transistor a gallium nitride compound semiconductor, a device having favorable high frequency characteristics and power characteristics can be obtained.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the drawings:

FIG. 5A shows the relationship between content by weight of copper and barrier height Φb, and FIG. 5B shows the relationship between content by weight of copper and ideality factor n;

FIG. 9 is a table showing approximate maximum thickness of various copper alloys.

DESCRIPTION OF THE PREFERRED EMBODIMENTS

The following describes MESFETs as examples of the preferred embodiments of the semiconductor device of the present invention, with reference to the drawings.

1. First Embodiment 1.1 Structure of the MESFET of the First Embodiment

The following describes the MESFET of the first embodiment.

Figure 1:
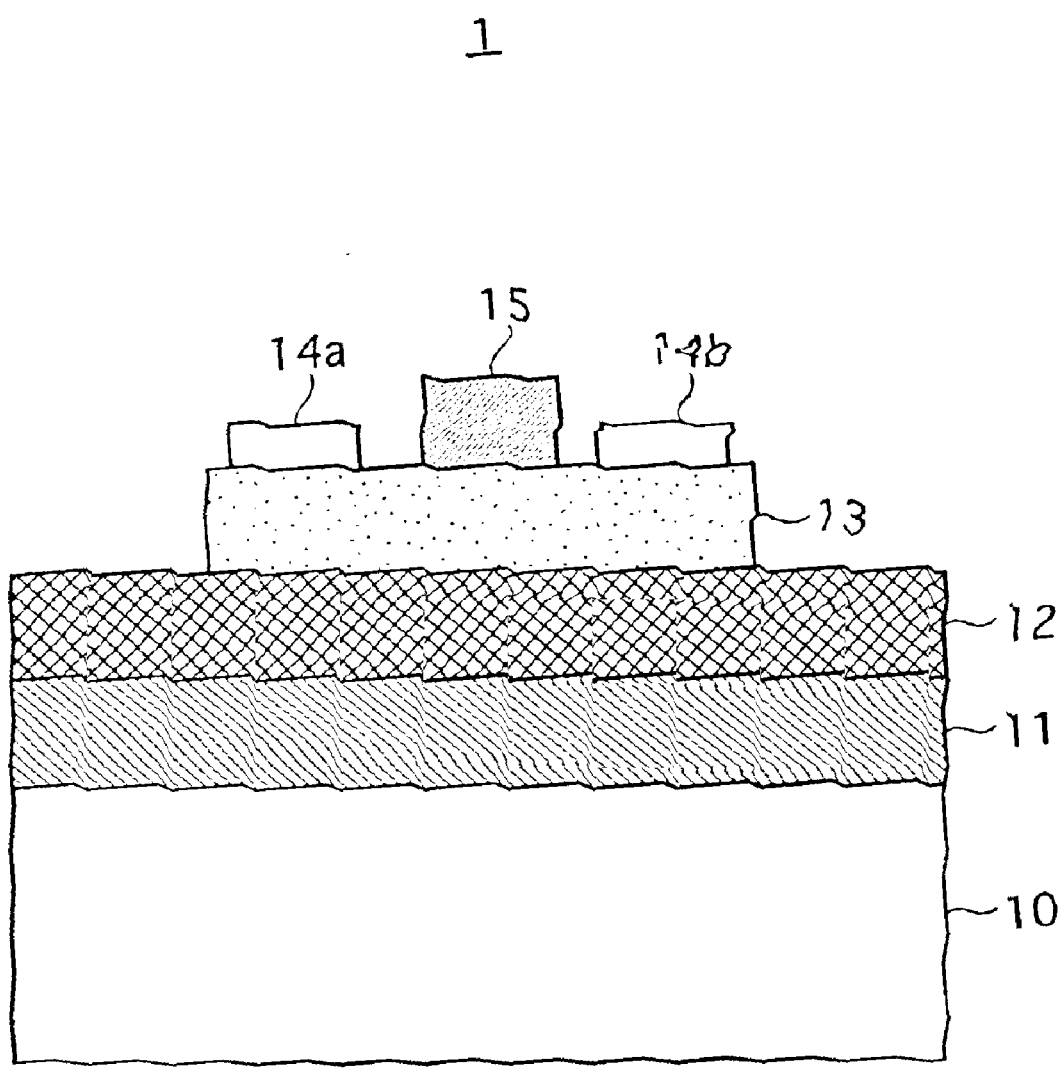
FIG. 1 shows a cross section of an MESFET in a first embodiment.

FIG. 1 shows a cross section of the MESFET of the first embodiment.

As shown in FIG. 1, an MESFET 1 is composed of a sapphire substrate 10 on which a buffer layer 11 and a gallium nitride layer 12 are formed in the stated order.

The gallium nitride layer 12 is an undoped layer of gallium nitride.

A gallium nitride active layer 13 is formed on the gallium nitride layer 12. The gallium nitride active layer 13 is an n-type layer that has been doped with silicon, and has a carrier density of $7*10^{17}$ cm$^{-3}$.

Three contacts are formed on the n-type gallium nitride active layer 13. These contacts are, specifically, ohmic contacts 14a and 14b, and a Schottky contact 15 formed between the ohmic contacts 14a and 14b. The ohmic contacts 14a and 14b are, respectively, the source contact and the drain contact in the MESFET 1, and the Schottky contact 15 is the gate contact in the MESFET 1. The Schottky contact 15 is made of a copper alloy palladium copper (PdCu), in which the content by weight of copper is approximately 5%.

1.2 Method for Manufacturing the MESFET of the First Embodiment

The following describes a method for manufacturing the MESFET 1 having the described structure.

Figure 2A:
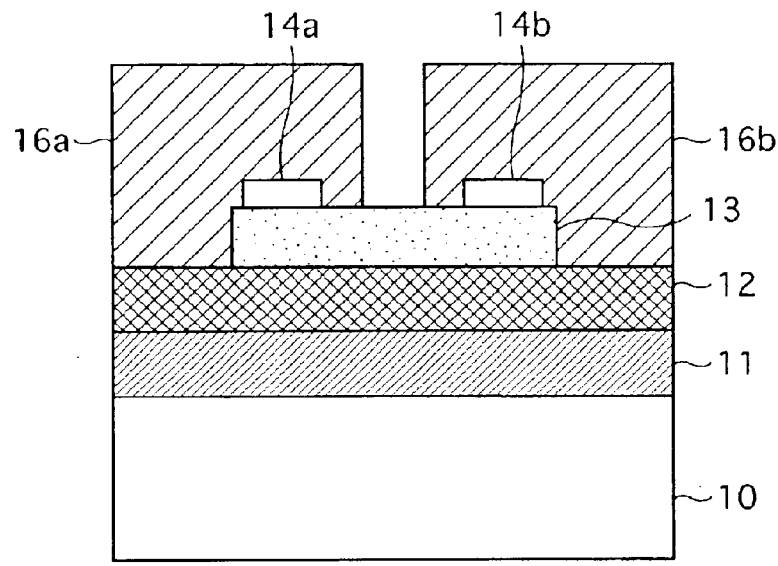
FIGS. 2A and 2B show the manufacturing process of the MESFET of the first embodiment, and in particular processes related to formation of a Schottky contact 15.
Figure 2B:
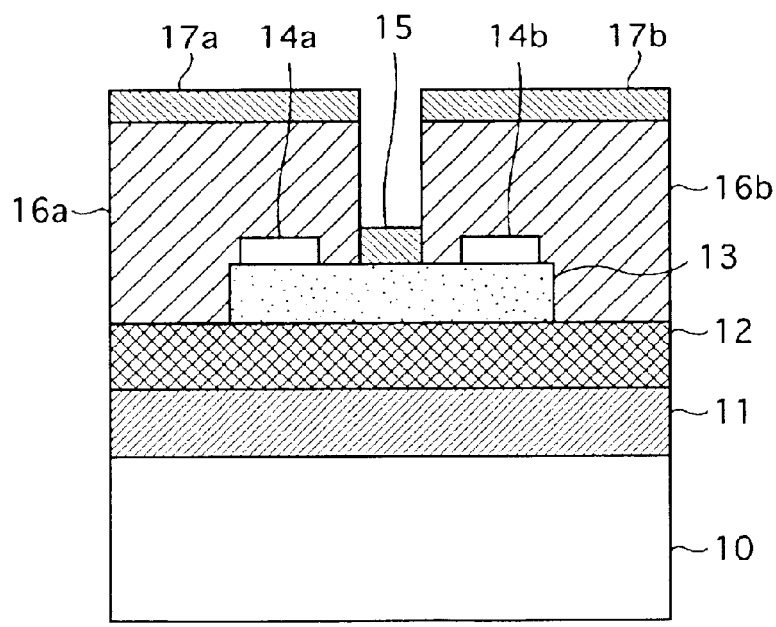

FIGS. 2A and 2B show a method for manufacturing the MESFET 1, and in particular processes relating to formation of the Schottky contact 15.

As shown in FIG. 2A, the buffer layer 11, the gallium nitride layer 12, and the n-type gallium nitride active layer 13 have been formed on the sapphire substrate 10, as described earlier, and ohmic contacts 14a and 14b have already been formed on the n-type gallium nitride active layer 13.

Electron beam-sensitive resists are applied on the MESFET 1 that has been manufactured as far as the state described above.

Next, an electron beam is irradiated on a position on the resists that corresponds to the Schottky contact 15. The resists are developed, resulting in formation of photoresist patterns 16a and 16b (FIG. 2A). An opening between these photoresist patterns 16a and 16b that exposes part of the n-type gallium nitride active layer 13.

Next, palladium copper films are formed on the MESFET 1 by vacuum deposition or the like.

FIG. 2B shows the appearance of the MESFET 1 after the palladium copper films are formed.

As can be seen from FIG. 2B, a palladium copper film is formed on each of the photoresist patterns 16a and 16b, and the n-type gallium nitride active layer 13. Finally, the photoresist patterns 16a and 16b are removed using a resist-removing liquid. An example of the resist-removing liquid is an organic solvent such as acetone.

The result is the palladium copper being left on the n-type gallium nitride active layer 13, thus obtaining the MESFET 1 shown in FIG. 1 (lift-off process).

Note that a combination of ultrasonic cleaning and high pressure spray cleaning are generally used to remove the resists and the palladium copper that has adhered to the resists.

1.3 Evaluation of the MESFET of the First Embodiment (1) Yield Ratio

The first point considered when evaluating adherence of the Schottky contact 15 and the n-type gallium nitride active layer 13 was the yield ratio for different gate lengths.

Figure 3:
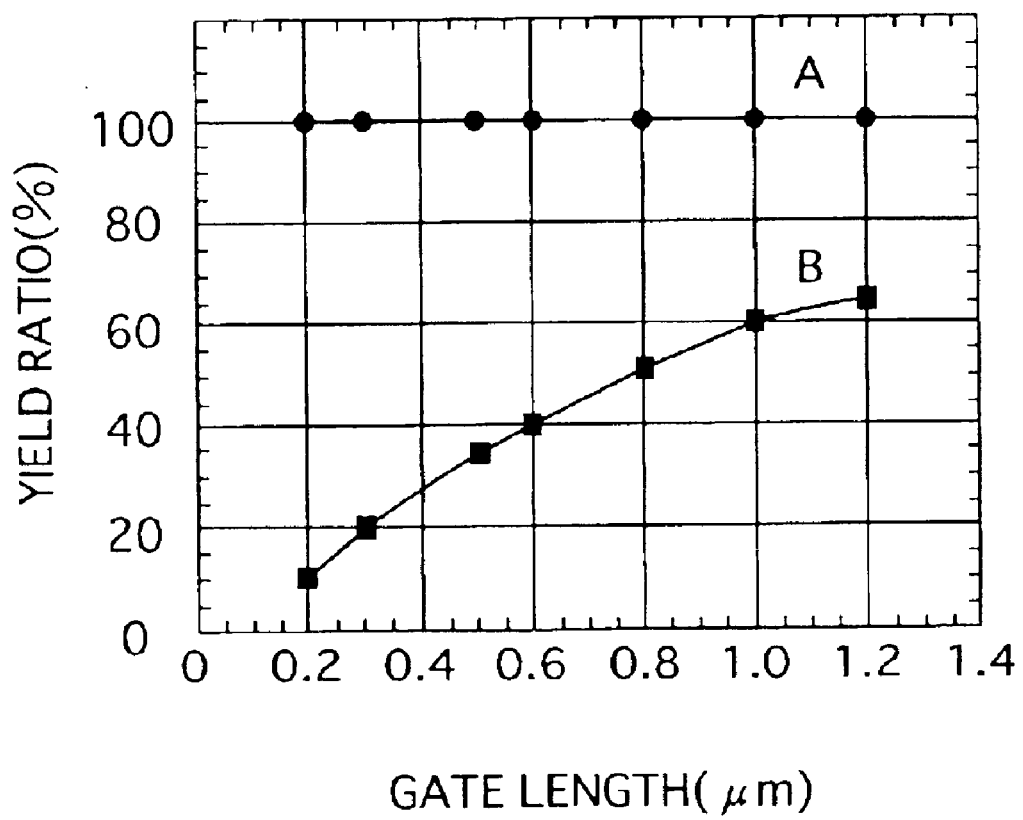
FIG. 3 is a graph showing the relationship between gate length and yield ratio for MESFETs of the first embodiment (line A) and conventional MESFETs (line B) in which Schottky contacts are made of palladium.

FIG. 3 is a graph showing the relationship between gate length and yield ratio for MESFETs 1 of the present embodiment and conventional MESFETs whose Schottky contacts are made of palladium.

In FIG. 3, a line A shows the relationship between gate length and yield ratio for the MESFETs 1 of the present embodiment, while a line B shows the relationship between gate length and yield ratio for the conventional MESFETs.

As the line B shows, the yield ratio varies greatly depending on the gate length in the conventional MESFETs. Specifically, when the gate length is 1 μm, the yield ratio is approximately 60%. In contrast, the yield ratio drops to 20% when the gate length is 0.3 μm, in other words, to one third of the yield ratio when the gate length is 1 μm. Thus, the yield ratio drops dramatically as the gate length is reduced in the conventional MESFETS. In contrast, as the line A shows, the yield ratio for the MESFETs 1 of the present embodiment is maintained constantly at approximately 100%, regardless of gate length.

In this way, it can be seen that superior adhesion is exhibited between the Schottky contact 15 and the n-type gallium nitride active layer 13 in the MESFETs 1 in the present embodiment.

Note that separation of the Schottky contact and the n-type gallium nitride active layer in the conventional MESFETs are caused entirely by the ultrasonic cleaning and high pressure spray cleaning in the lift-off process. It is not impossible to reduce separation by lowering the power of the ultrasonic cleaning and the pressure of the high pressure spray cleaning, but such measures will prevent the metal film from being properly removed from the photoresist pattern, and consequently reduce the yield ratio. For this reason also, it is difficult to improve yield ratio with conventional MESFETs.

In contrast, ultrasonic cleaning and high pressure spray cleaning in the lift-off process caused no separation at all of the Schottky contact in the MESFETs 1 of the present embodiment. This means that it is not necessary to take measures such as lowering the power of the ultrasonic cleaning, and consequently, there is no reduction in yield ratio caused by metal film left on the photoresist patterns. In this way, a yield ratio of approximately 100% is achieved in the present embodiment.

(2) Forward Current-Voltage Characteristics and Reverse Voltage Characteristics

Next, forward current-voltage characteristics and reverse voltage characteristics were measured in a Schottky diode formed under the same conditions as the MESFET 1, in order to evaluate the Schottky characteristics of the MESFET 1 of the present embodiment.

Here, the surface area of the Schottky diode was approximately 100 μm².

Figure 4:
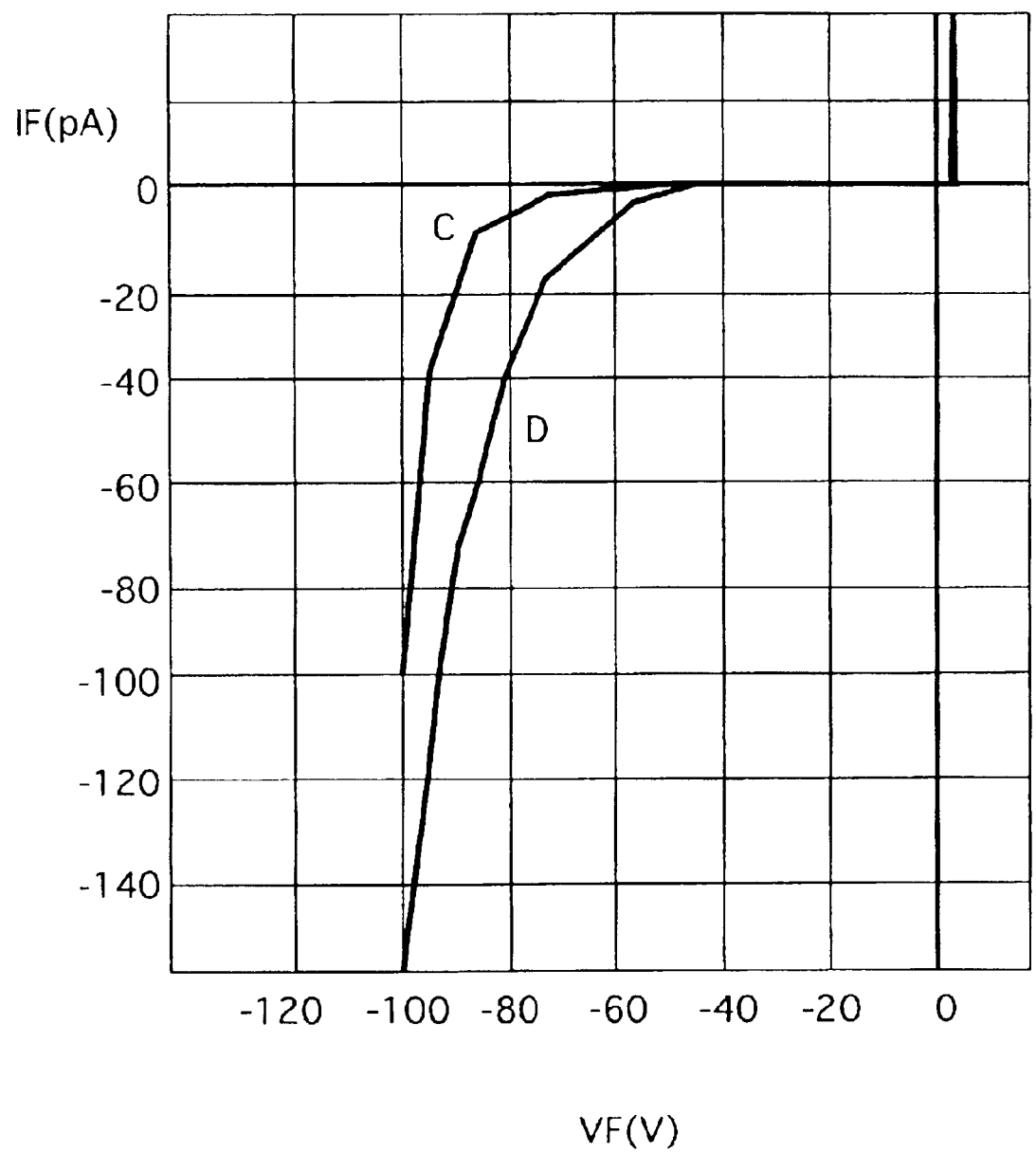
FIG. 4 is a graph showing respective forward current-voltage characteristics of a Schottky diode formed under the same conditions as the MESFET of the first embodiment (line C), and a conventional Schottky diode (line D)

FIG. 4 is a graph showing respective forward and reverse current-voltage characteristics of the Schottky diode formed under the same conditions as the MESFET 1 (hereinafter referred to as "the Schottky diode of the present embodiment") and a conventional Schottky diode.

Here, the Schottky contact of the conventional Schottky diode is made only of palladium.

A line C in FIG. 4 shows forward current-voltage characteristics of the Schottky diode of the present embodiment, while a line D shows forward current-voltage characteristics of the conventional Schottky diode.

As shown in FIG. 4, the Schottky diode of the present embodiment was confirmed as exhibiting approximately the same forward current-voltage characteristics as the conventional Schottky diode.

In regard to reverse voltage characteristics, FIG. 4 shows that in the Schottky diode of the present embodiment the current is −100 pA when the voltage is 100V, and in the conventional Schottky diode, the current is −150 pA when the voltage is 100V. In other words, reverse voltage characteristics are approximately the same in the Schottky diode of the present embodiment and the conventional Schottky diode.

(3) Barrier Height and Ideality Factor

Additional Schottky characteristics that were measured are barrier height and ideality factor n.

The Schottky diode of the present embodiment has a barrier height of 0.95 eV and an ideality factor n of 1.25. On the other hand, the conventional Schottky diode has a barrier height of 0.94 eV and an ideality factor n of 1.27. In other words, barrier height and ideality factor n are approximately the same in both the Schottky diode of the present embodiment and the conventional Schottky diode.

Figure 5A:
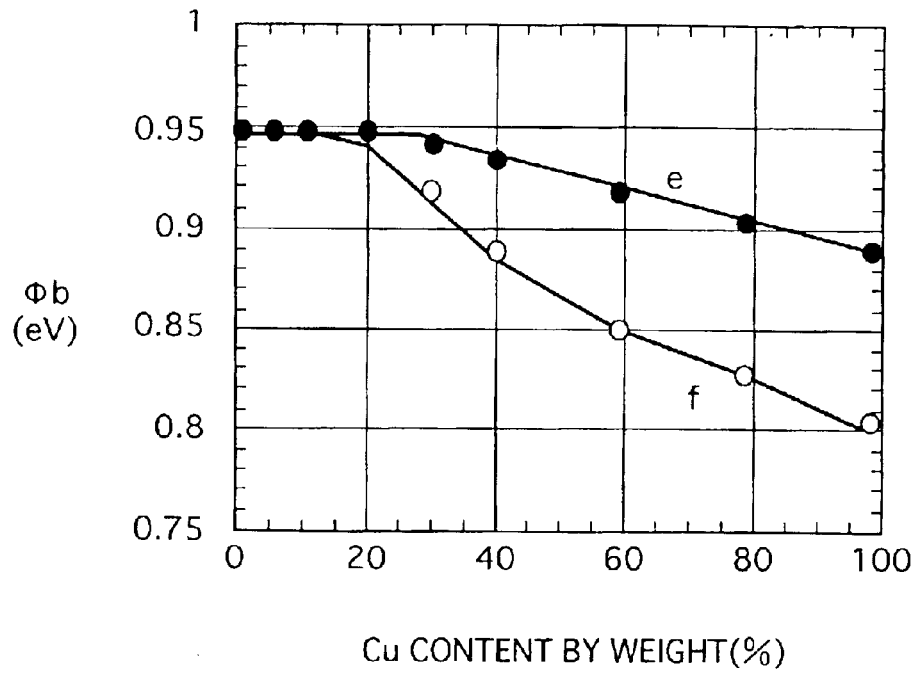
FIGS. 5A and 5B are graphs showing the relationship between content by weight of copper in palladium copper and Schottky characteristics before and after aging, and in particular.
Figure 5B:
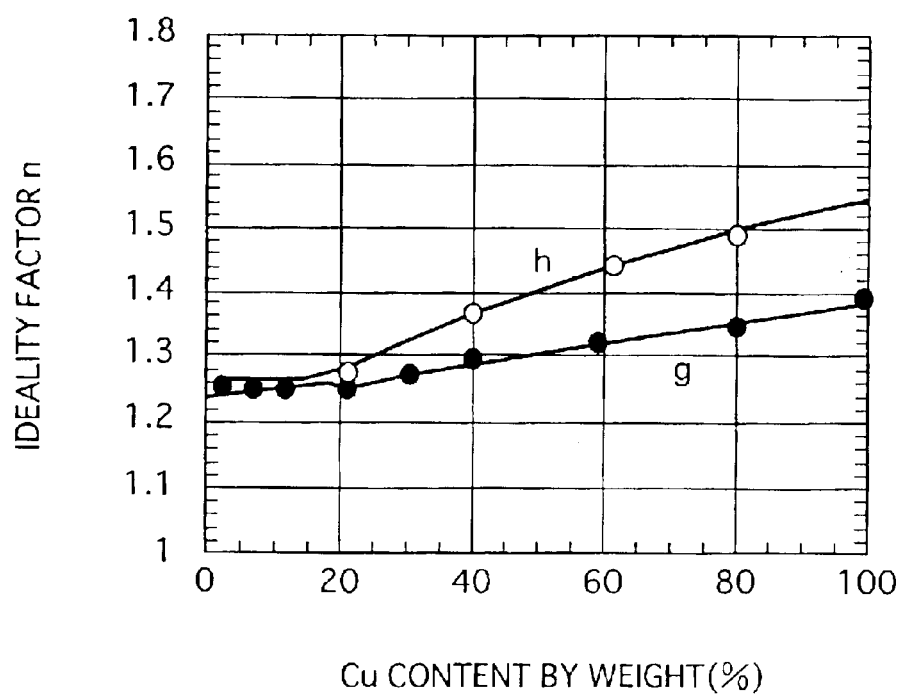

FIGS. 5A and 5B are graphs showing the relationship between content by weight of copper in palladium copper and Schottky characteristics for Schottky contacts having a surface areas of 100 μm².

FIG. 5A shows the relationship between content by weight of copper and barrier height φb, and FIG. 5B shows the relationship between content by weight of copper and ideality factor n. FIGS. 5A and 5B also show Schottky characteristics after aging.

In FIG. 5A, a line e shows barrier height before aging, and f shows barrier height after aging.

As shown in FIG. 5A, when the content by weight of copper is 20% or less, the palladium copper of the present invention achieves an equal barrier height as a Schottky contact that uses simple palladium, and the barrier height shows almost no deterioration with aging.

When the copper exceeds 20% content by weight, the barrier height gradually decreases, and the degree of deterioration due to aging increases. This is thought to be because the influence of oxidation of copper due to aging increases as the content by weight of the copper increases. Influence by the oxidation of copper includes, for example, heightening of electrical resistance of the palladium copper.

A line g in FIG. 5B shows the ideality factor n before aging, and the line h shows the ideality factor n after aging. As shown in FIG. 5B, when the content by weight of copper is approximately 20% or less, the palladium copper of the present invention achieves an equal ideality factor n as a Schottky contact that uses simple palladium, and that shows almost no deterioration with aging. When the copper exceeds 20% volume per weight, the ideality factor n becomes gradually removed from an ideal value 1. Furthermore, it can be seen that the degree of deterioration due to aging increases when the content by weight of copper exceeds 20%.

2. Second Embodiment

The following describes the second embodiment of the present invention using an example of an MESFET similar to that in the first embodiment, with use of the drawings.

2.1 Structure of the MESFET of the Second Embodiment

Figure 6:
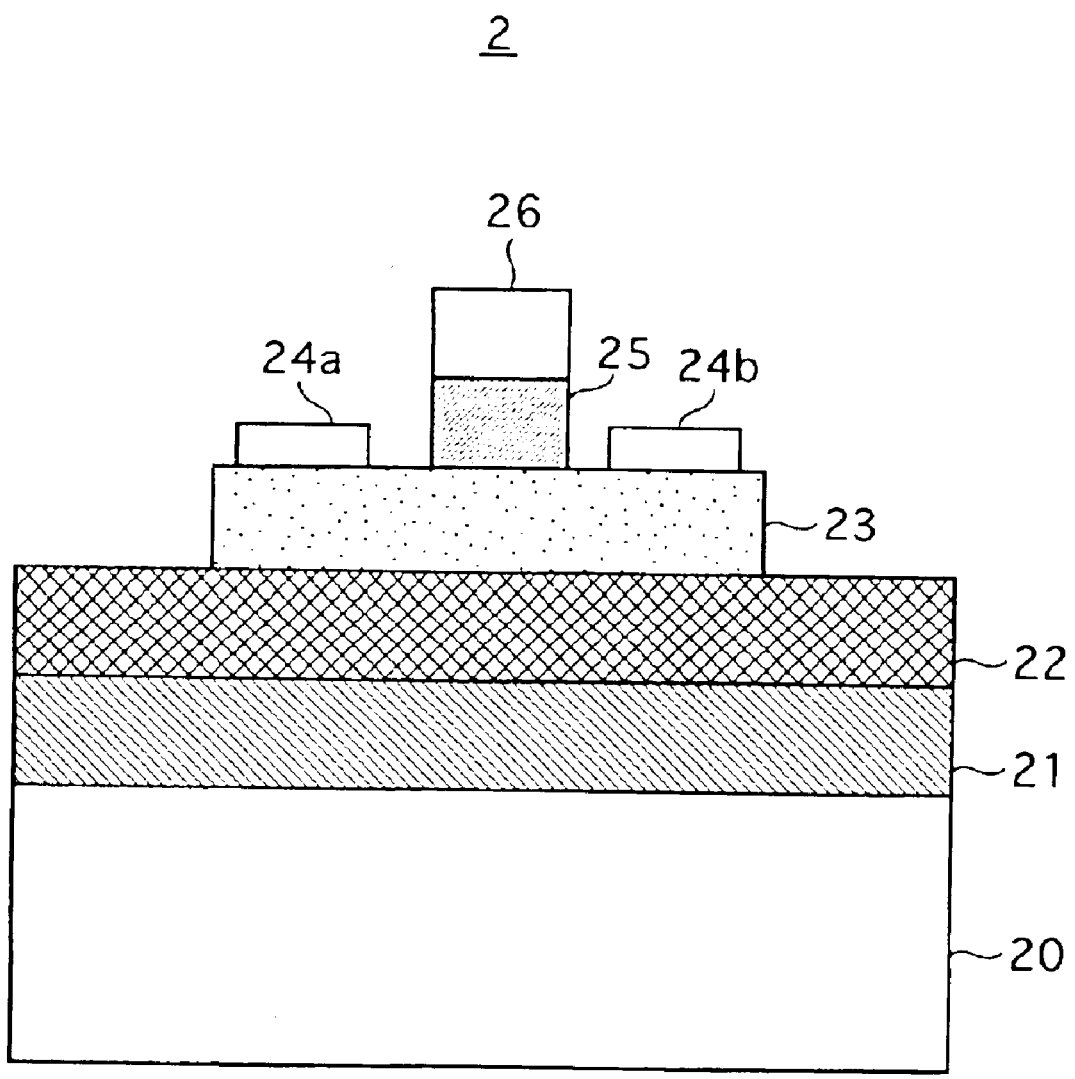
FIG. 6 shows a cross section of an MESFET of the second embodiment.

FIG. 6 shows a cross section of an MESFET of the present embodiment.

As shown in FIG. 6, an MESFET 2 is composed of a sapphire substrate 20 on which is formed a buffer layer 21, an undoped gallium nitride layer 22 and an n-type gallium nitride active layer 23.

The buffer layer 21 is made of gallium nitride, and is approximately 20 nm thick. The undoped gallium nitride layer 22 is approximately 2 μm thick.

The n-type gallium nitride active layer 23 is doped with silicon, and has a carrier density of $7*10^{17}$ cm$^{-3}$. Furthermore, the n-type gallium nitride active layer 23 is approximately 100 nm thick.

Three contacts are formed on the n-type gallium nitride active layer 23. The structure of the three contacts in the MESFET 2 of the present embodiment differs from the structure of the corresponding contacts in the MESFET 1 in the first embodiment. Specifically, the source and drain contacts in the MESFET 2 are ohmic contacts 24a and 24b respectively, each of which has a two-layer structure consisting of a titanium layer and an aluminum layer, the titanium layer being the closer to the n-type gallium nitride active layer 23. Each titanium layer is approximately 20 nm thick, while each aluminum layer is approximately 200 nm thick.

A Schottky contact 25 is the gate contact in the MESFET 2. A metal layer 26 is formed on the opposite side of the Schottky contact 25 to the n-type gallium nitride active layer 23. The Schottky contact 25 has the same composition as the Schottky contact 15 of the MESFET 1, specifically, it is made of palladium copper in which the content by weight of copper is 5%. Furthermore, the metal layer 26 has a titanium layer, a platinum layer, and a gold layer formed thereon in the stated order. Here, the Schottky contact 25 is approximately 50 nm thick, and the titanium layer, the platinum layer and the gold layer are, respectively, approximately 50 nm, approximately 50 nm, and approximately 200 nm thick. The metal layers provided on the Schottky contact 25 in this way reduce the electrical resistance of the gate contact of the MESFET 2.

2.2 Method for Manufacturing the MESFET of the Second Embodiment

The following describes the method for manufacturing the MESFET 2.

Figure 7A:
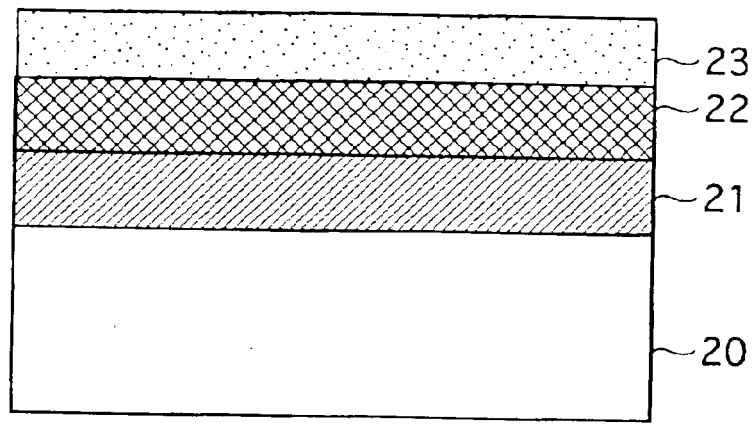
FIGS. 7A and 7B show processes in a method for manufacturing the MESFET of the second embodiment.
Figure 7B:
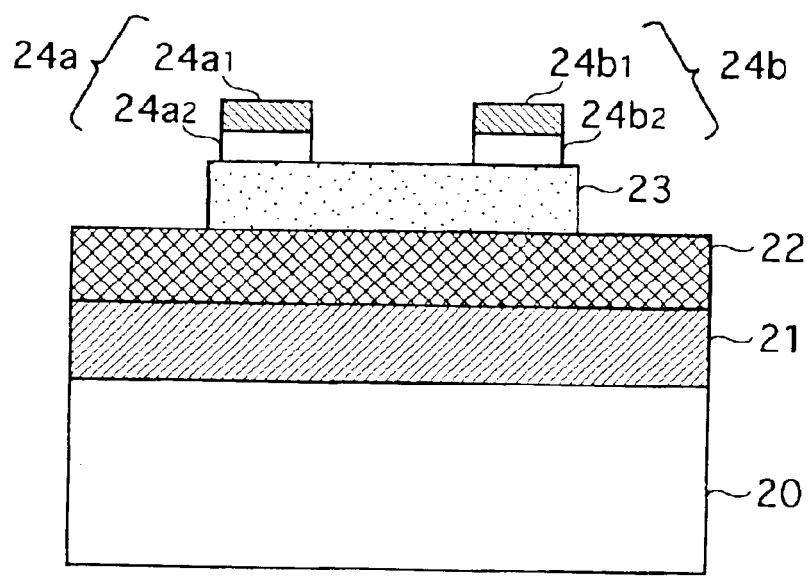

FIGS. 7A and 7B show processes in the method for manufacturing the MESFET 2.

The buffer layer 21, the gallium nitride layer 22 and the n-type gallium nitride compound active layer 23 are formed on the sapphire substrate 20 as shown in FIG. 7A, by metal-organic chemical vapor deposition (MOCVD).

Next, the n-type gallium nitride compound active layer 23 is partially removed by mesa-etching, leaving a mesa. The MESFET is formed on this mesa. The ohmic contacts 24a and 24b are then formed on the mesa n-type gallium nitride compound active layer 23. The ohmic contacts 24a and 24b are formed according to a lift-off process, by first depositing titanium layers 24a2 and 24b2, and then depositing aluminum layers 24a1 and 24b1.

After the lift-off process, the sapphire substrate 20 with the layers formed thereon as described is subject to annealing at 600° C. for one minute.

After the ohmic contacts 24a and 24b have been formed in this manner, the Schottky contact 25 and the metal layer 26 are formed according to a lift-off process. Specifically, after a resist is applied to the MESFET 2, an opening is provided in a position that corresponds to the Schottky contact 25.

Next, after the metals palladium copper, titanium, platinum, and gold have been deposited in the stated order, the resist is removed, to complete the MESFET 2.

2.3 Performance Evaluation

The following shows results obtained by measuring performance of the MESFET 2 of the present embodiment.

Figure 8:
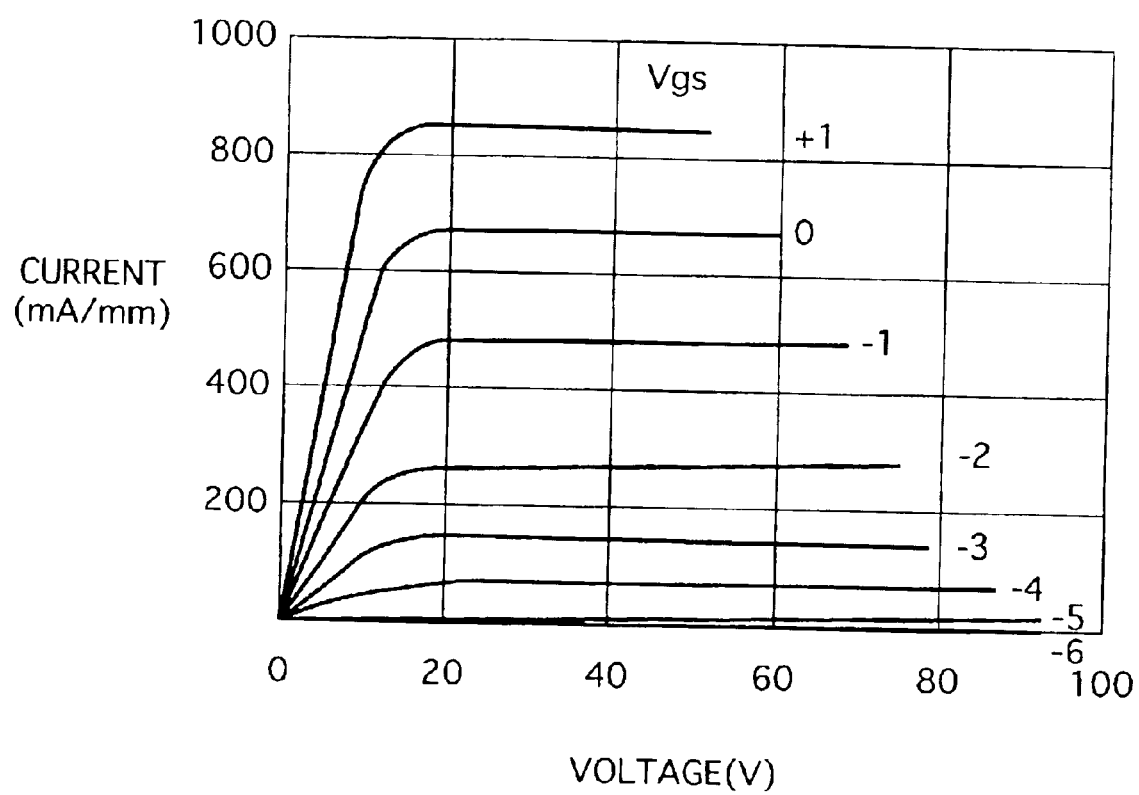
FIG. 8 is a graph showing static characteristics of the MESFET of the second embodiment.

FIG. 8 shows results of measuring the performance of the MESFET 2 of the present embodiment.

As can be seen from FIG. 8, the MESFET 2 has high current drive power. For example, when the gate voltage is increased from 0V to 1V, the current increases by approximately 200 mA. Furthermore, since the MESFET 2 has superior reverse voltage characteristics, similar to those shown in FIG. 4 in the first embodiment, favorable FET characteristics can be obtained even when the drain voltage is approximately 50V.

In addition, as with the MESFET 1 of the first embodiment, the yield ratio for the MESFET 2 is approximately 100%, and processing defects such as the Schottky contact 25 coming off or peeling were not observed.

A high yield ratio is achieved with the Schottky contact 25 of the MESFET 2 due to the metal layer 26 thereon which enables the Schottky contact 25 to receive higher power in the ultrasonic cleaning and the high-pressure cleaning than the Schottky contact 15 in the MESFET 1 of the first embodiment. This demonstrates the remarkable effectiveness of the present invention.

3. Modifications

The preceding is a description of the preferred embodiments of the present invention, but it should be obvious that the present invention is not limited to the described preferred embodiments. The following are some possible modifications.

(1) Instead of the Schottky contact being made of palladium copper as described in the preferred embodiments, the Schottky contact may instead be made of a gold, platinum or nickel copper alloy.

Specifically, even if a copper alloy such as gold copper (AuCu), platinum copper (PtCu), or nickel copper (NiCu) is used as the Schottky metal, Schottky characteristics obtained when a simple metal, not an alloy, is used can be realized, while also preventing separation of the Schottky contact.

Note that it is possible for the Schottky contact to be made of only copper.

(2) When applying a FET that uses a gallium nitride compound semiconductor to a high frequency device, it is important to lower gate resistance.

The electrical resistance of palladium copper described earlier is higher than that of simple palladium. This is the same for other alloys such as gold copper, platinum copper and nickel copper. In particular, the electrical resistance of simple palladium, platinum and nickel is higher than even that of gold and aluminum. Therefore, it is essential to select a material appropriately to lower electrical resistance in a gate contact. For this reason, gate resistance is lowered in the second embodiment by forming the metal layer 26 from the metals titanium, platinum and gold, which have relatively low electrical resistance, on the Schottky contact 25 that is made from platinum copper, which is a copper alloy having relatively high electrical resistance.

The structure of the metal layer 26 is not limited to the described combinations of metal, and gate resistance may be lowered using other combinations of metals. For example, it is possible to use chrome instead of titanium, or copper instead of gold, or to use any other metal or metals that have low resistance. Here, it is effective to use metals such as chrome and copper in which structural change such as interdiffusion is not easily induced by heating.

Furthermore, the number of types of metal used is not limited to three, but may be more or less than three.

In addition, the electrical resistance of the gate contact may be lowered by thickening the gate contact. Gold copper is the most suitable of the described copper alloys for lowering electrical resistance of the gate contact because it can be have a thickness of 2,000 nm.

FIG. 9 shows approximate maximum thickness of each of the copper alloys.

If a metal layer that exceeds the maximum thickness for the particular alloy used is formed according to depositing or the like, problems such as peeling of the metal layer will occur, and yield ratio will consequently drop. This problem can be avoided by layering the metal layers as described to achieve a thick metal layer, and lower electrical resistance.

(3) The content by weight of copper in the palladium copper is not limited to being 5% as described in the preferred embodiments, but may be another percentage. If the content by weight of copper is no more than approximately 20%, as shown in FIG. 5 described earlier, similar Schottky characteristics can be obtained as when the Schottky contact is formed from simple palladium, and favorable adhesive performance is realized.

Furthermore, even if the content by weight of copper exceeds 20%, more favorable Schottky characteristics can be realized than with a conventional Schottky contact made of simple nickel. Similarly, in the case of platinum copper, similar Shottky characteristics as simple platinum can be realized when the content by weight of copper is no more than approximately 20%, and superior adhesive performance can be achieved. The same effect can be achieved with nickel copper and gold copper.

(4) Although an MESFET that includes an n-type gallium nitride active layer is described as an example in the preferred embodiments, the present invention obtains the same effect in other types of field effect transistors, such as an HFET (heterostructure field effect transistor) having AlGaN/GaN heterostructure, if the Schottky contact is made of copper alloy.

In addition, the present invention is effective when applied to a gallium nitride compound semiconductor device expressed as $In_XAl_YGa_{1-X-Y}N$ ($0 \leq X < 1$, $0 \leq Y < 1$, $0 \leq X+Y < 1$).

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A semiconductor device, comprising:
   a gallium nitride compound semiconductor layer; and
   a Schottky contact formed on the gallium nitride compound semiconductor layer and make of a copper alloy.
2. The semiconductor device of claim 1,
   wherein the copper alloy contains gold.
3. A semiconductor device, comprising:
   a gallium nitride compound semiconductor layer; and
   a Schottky contact formed on the gallium nitride compound semiconductor layer and make of a copper alloy.
4. A semiconductor device, comprising:
   a gallium nitride compound semiconductor layer; and
   a Schottky contact formed on the gallium nitride compound semiconductor layer and make of a copper alloy,
   wherein the copper alloy contains platinum.
5. A semiconductor device, comprising:
   a gallium nitride compound semiconductor layer; and
   a Schottky contact formed on the gallium nitride compound semiconductor layer and make of a copper alloy,
   wherein the copper alloy contains nickel.
6. A semiconductor device, comprising:
   a gallium nitride compound semiconductor layer; and
   a Schottky contact formed on the gallium nitride compound semiconductor layer and make of a copper alloy,
   wherein content by weight of copper in the copper alloy is 20% or less.
7. A semiconductor device having a gate contact, a source contact, and a drain contact, the semiconductor device comprising:
   a gallium nitride compound semiconductor layer; and
   a Schottky contact formed on the gallium nitride compound semiconductor layer and make of a copper alloy, the Schottky contact comprising the gate contact for controlling the current flow between the source contact and the drain contact of the semiconductor device.
8. The semiconductor device of claim 7,
   wherein the copper alloy contains palladium.
9. The semiconductor device of claim 8,
   wherein the thickness of the copper alloy containing palladium is not more than 200 nm.
10. A semiconductor device having a gate contact, a source contact, and a drain contact, the semiconductor device comprising:
    a gallium nitride compound semiconductor layer; and
    a schottky contact formed on the gallium nitride compound semiconductor layer and made of a copper alloy containing gold, the Schottky contact comprising the gate contact for controlling the current flow between the source contact and the drain contact of the semiconductor device.
11. The semiconductor device of claim 10,
    wherein the thickness of the copper alloy containing gold is not more than 2000 nm.
12. A semiconductor device having a gate contact, a source contact, and a drain contact, the semiconductor device comprising:
    a gallium nitride compound semiconductor layer; and
    a Schottky contact formed on the gallium nitride compound semiconductor layer and made of a copper alloy containing platinum, the Schottky contact and the drain contact of the semiconductor device.
13. The semiconductor device of claim 12,
    wherein the thickness of the copper alloy containing platinum is not more than 200 nm.
14. A semiconductor device having a gate contact, a source contact, and a drain contact, the semiconductor device comprising:
    a gallium nitride compound semiconductor layer; and
    a Schottky contact formed on the gallium nitride compound semiconductor layer and made of a copper alloy containing nickel, the Schottky contact comprising the gate contact for controlling the current flow between the source contact and the drain contact of the semiconductor device.
15. The semiconductor device of claim 14,
    wherein the thickness of the copper alloy containing nickel is not more than 200 nm.
16. A semiconductor device having a gate contact, a source contact, and a drain contact, the semiconductor device comprising:
    a gallium nitride compound semiconductor layer; and
    a Schottky contact formed on the gallium nitride compound semiconductor layer and made of a copper alloy, the Schottky contact comprising the gate contact for controlling the current flow between the source contact and the drain contact of of the semiconductor device, wherein content by weight of copper in the copper alloy is 20% or less.

* * * * *